(12) United States Patent
Blodgett

(10) Patent No.: US 6,199,177 B1
(45) Date of Patent: Mar. 6, 2001

(54) DEVICE AND METHOD FOR REPAIRING A SEMICONDUCTOR MEMORY

(75) Inventor: Greg A. Blodgett, Nampa, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/143,283

(22) Filed: Aug. 28, 1998

(51) Int. Cl.[7] .................................................. G06F 11/00
(52) U.S. Cl. .............................................. 714/7; 714/718
(58) Field of Search .................................. 714/7, 6, 5, 3, 714/8, 25, 30, 32, 42, 44, 718, 719, 733; 365/200, 201

(56) References Cited

U.S. PATENT DOCUMENTS

| | | | |
|---|---|---|---|
| 4,459,685 | 7/1984 | Sud et al. | 365/200 |
| 4,601,019 | 7/1986 | Shah et al. | 365/200 |
| 5,179,536 * | 1/1993 | Kasa et al. | 365/200 |
| 5,381,370 * | 1/1995 | Lacey et al. | 365/200 |
| 5,422,850 | 6/1995 | Sukegawa et al. | 365/200 |
| 5,452,251 * | 9/1995 | Akaogi et al. | 365/200 |
| 5,513,144 * | 4/1996 | O'Toole | 365/200 |
| 5,528,539 | 6/1996 | Ong et al. | 365/200 |
| 5,548,225 | 8/1996 | Rountree et al. | 326/13 |
| 5,594,693 * | 1/1997 | Rouy et al. | 365/200 |
| 5,604,702 * | 2/1997 | Tailliet | 365/200 |
| 5,648,934 * | 7/1997 | O'Toole | 365/200 |
| 5,684,740 * | 11/1997 | Hirata | 365/185.09 |
| 5,729,551 * | 3/1998 | Park et al. | 371/10.3 |
| 5,751,647 * | 5/1998 | O'Toole | 365/200 |
| 5,914,907 * | 6/1999 | Kobayashi et al. | 365/230.03 |
| 6,038,682 * | 3/2000 | Norman | 714/10 |

* cited by examiner

Primary Examiner—Nadeem Iqbal
(74) Attorney, Agent, or Firm—Trask Britt

(57) ABSTRACT

A block repair device is used in a Dynamic Random Access Memory (DRAM) having a primary array with a defective cell and a redundant array with a redundant row. The block repair device includes a set of fuses, anti-fuses, or flash EEPROM cells that store a block repair configuration that determines the dimensions (e. g., the number of rows and columns spanned) of a repair block used to repair the defective cell. Routing circuitry, such as mux circuitry, in the block repair device is configured by the stored block repair configuration to output some row and column address bits from received row and column addresses in a selected ratio. Comparison circuitry in the block repair device then compares the row and column address bits output by the routing circuitry with a stored portion of the address of the defective cell that defines the repair block. When a match occurs, the comparison circuitry implements a block repair by activating the redundant row and by causing data to be written to or read from the activated redundant row instead of the primary array.

26 Claims, 7 Drawing Sheets

DEVICE AND METHOD FOR REPAIRING A SEMICONDUCTOR MEMORY

BACKGROUND OF THE INVENTION

1. Technical Field

This invention relates in general to memory cell redundancy in semiconductor memories and, more particularly, to devices and methods for repairing semiconductor memories by replacing memory blocks that contain failing memory cells with redundant rows or columns of cells.

2. State of the Art

Semiconductor memories generally include a multitude of memory cells arranged in rows and columns. Each memory cell is capable of storing digital information in the form of a "1" or a "0" bit. To write (i.e., store) a bit into a memory cell, a binary memory address having portions identifying the cell's row (the "row address") and column (the "column address") is provided to addressing circuitry in the semiconductor memory to activate the cell, and the bit is then supplied to the cell. Similarly, to read (i.e., retrieve) a bit from a memory cell, the cell is again activated using the cell's memory address, and the bit is then output from the cell.

Semiconductor memories are typically tested after they are fabricated to determine if they contain any failing memory cells (i.e., cells to which bits cannot be dependably written or from which bits cannot be dependably read). Generally, when a semiconductor memory is found to contain failing memory cells, an attempt is made to repair the memory by replacing the failing memory cells with redundant memory cells provided in redundant rows or columns in the memory.

Conventionally, when a redundant row is used to repair a semiconductor memory containing a failing memory cell, the failing cell's row address is permanently stored (typically in pre-decoded form) on a chip on which the semiconductor memory is fabricated by programming a non-volatile element (e.g., a group of fuses, anti-fuses, or FLASH memory cells) on the chip. Then, during normal operation of the semiconductor memory, if the memory's addressing circuitry receives a memory address including a row address that corresponds to the row address stored on the chip, redundant circuitry in the memory causes a redundant memory cell in the redundant row to be accessed instead of the memory cell identified by the received memory address. Since every memory cell in the failing cell's row has the same row address, every cell in the failing cell's row, both operative and failing, is replaced by a redundant memory cell in the redundant row.

Similarly, when a redundant column is used to repair the semiconductor memory, the failing cell's column address is permanently stored (typically in pre-decoded form) on the chip by programming a non-volatile element on the chip. Then, during normal operation of the semiconductor memory, if the memory's addressing circuitry receives a memory address including a column address that corresponds to the column address stored on the chip, redundant circuitry in the memory causes a redundant memory cell in the redundant column to be accessed instead of the memory cell identified by the received memory address. Since every memory cell in the failing cell's column has the same column address, every cell in the failing cell's column, both operative and failing, is replaced by a redundant memory cell in the redundant column.

Thus, for example, as shown in FIG. 1, a semiconductor memory 20 having failing memory cells 22, 24, 26, 28, 30, 32, 34, and 36 is repaired in the conventional manner described above using redundant rows 38, 40, and 42 and redundant columns 44, 46, and 48. As described above, the memory 20 is repaired by replacing all memory cells in columns 50, 52, and 54, including failing memory cells 22, 24, 26, and 28, with redundant memory cells in redundant columns 44, 46, and 48. Further repairs to the memory 20 are accomplished by replacing all memory cells in rows 56, 58, and 60, including failing memory cells 30, 32, 34, and 36, with redundant memory cells in redundant rows 38, 40, and 42.

The process described above for repairing a semiconductor memory using redundant rows and columns is well known in the art, and is described in various forms in U.S. Pat. Nos. 4,459,685, 4,601,019, 5,422,850, and 5,528,539.

Unfortunately, it is difficult to provide enough redundant rows or columns in a semiconductor memory to repair all failing memory cells therein using the conventional repair process described above without using an excessive amount of space (commonly known as "real estate") in the memory for the redundant rows or columns. With the increasing size of semiconductor memories continuously increasing the need for redundancy, memory designers find themselves caught between providing sufficient redundancy to successfully repair most memories and, as a result, using excessive space in the memories, or providing insufficient redundancy to save space in the memories and, as a result, having to discard memories that are un-repairable. Obviously, neither alternative is desirable.

U.S. Pat. No. 5,548,225 to Rountree et al. discloses a repair system that, in contrast to the conventional repair system described above, does not use an entire redundant row or column to repair each defective memory cell in a semiconductor memory. In the Rountree repair system, the column address of a defective memory cell is stored using fuses in the same manner as described above. In addition, though, a partial row address common to a group of cells in the defective cell's column that includes the defective cell itself is also stored using fuses. When a memory address is received having column and row addresses that match the stored column address and stored partial row address, a redundant memory cell in a spare column is accessed. As a result, all of the cells in the group identified by the stored column address and stored partial row address are replaced by redundant cells in the spare column, while those cells in the defective cell's column not in the identified group are not replaced. Thus, the efficiency of repairs is increased by the Rountree system because only some of the redundant cells in the spare column are used to repair the defective cell, while other redundant cells remain in the spare column to repair other defective cells.

Unfortunately, the Rountree repair system can be problematic as well, because storing a full column address and a partial row address for every defective memory cell in need of repair requires a great deal of storage space (e.g., fuses, etc.). Consequently, the ever-increasing size of modern semiconductor memories, and the corresponding increase in the number of defective memory cells typically found, makes the Rountree repair system increasingly prohibitive to use because of the amount of storage space it requires.

Therefore, there is a need in the art for an improved device and method for repairing a semiconductor memory containing a failing memory cell. Such a device and method should replace the failing cell with a redundant memory cell without replacing the failing cell's entire row or column with the redundant cell's entire row or column. The device should also replace multiple failing cells in different rows or columns with redundant memory cells in a single redundant row or column in order to make more efficient use of redundant rows and columns, and should do so without the excessive need for storage space characteristic of the Rountree repair system.

SUMMARY OF THE INVENTION

A block repair device in accordance with the present invention is used in a semiconductor memory, such as a Dynamic Random Access Memory (DRAM), having a primary array with a defective cell and a redundant array with a redundant row. The block repair device includes a set of non-volatile elements, such as fuses, anti-fuses, or flash EEPROM cells, that store a block repair configuration that determines the dimensions (e.g., the number of rows and columns spanned) of the repair block used to repair the defective cell. Routing circuitry, such as mux circuitry, in the block repair device is configured by the block repair configuration to output some received row and column address bits in a selected ratio. Comparison circuitry in the block repair device then compares the row and column address bits output by the routing circuitry with a stored portion of the address of the defective cell that defines the repair block. When a match occurs, the comparison circuitry implements a block repair by activating the redundant row and by causing data to be written to or read from the activated redundant row instead of the primary array.

The present invention thus provides an efficient device for implementing block repairs in a semiconductor memory. The device requires relatively few fuses or other non-volatile elements to implement a repair, in contrast to the Rountree and other conventional methods described above.

In other embodiments of the invention, the block repair device described above is incorporated into a semiconductor memory, a semiconductor substrate, such as a wafer, a DRAM, and an electronic system.

In a block repair method according to the present invention, a semiconductor memory having a primary array with a defective cell and a redundant array with a redundant row is repaired using a block repair. The dimensions of a repair block within the primary array for repairing the defective cell are first selected, and those row and column address bits of the defective cell that define the selected dimensions of the repair block are then stored using, for example, non-volatile elements within the semiconductor memory. A block repair configuration that corresponds to the selected dimensions of the repair block is also stored using, for example, non-volatile elements. Those received row and column address bits necessary to determine whether a received address falls within the repair block are then routed in accordance with the stored block repair configuration for comparison with the stored row and column address bits of the defective cell. When a match occurs, memory operations within the primary array are temporarily disabled, the redundant row is fired, and data is then written to or read from a cell within the redundant row selected in accordance with non-stored row and column address bits of the defective cell.

DETAILED DESCRIPTION OF THE ILLUSTRATED EMBODIMENTS

Some general characteristics of the present invention will be described with respect to FIG. 2. This description will be followed by a detailed description of various embodiments of the present invention in connection with FIGS. 3–10.

Figure 1:
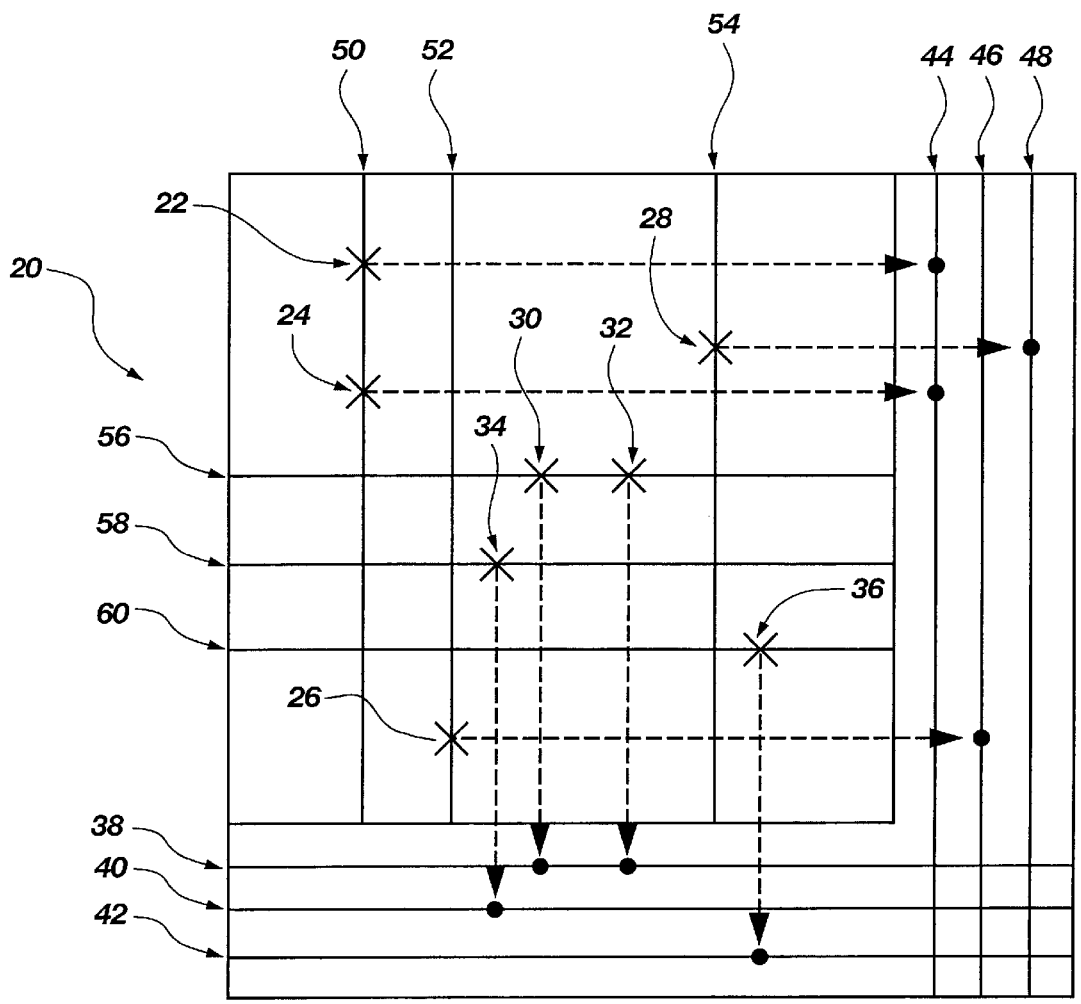
FIG. 1 is a prior art diagram illustrating conventional row and column redundancy in a semiconductor memory.
Figure 2:
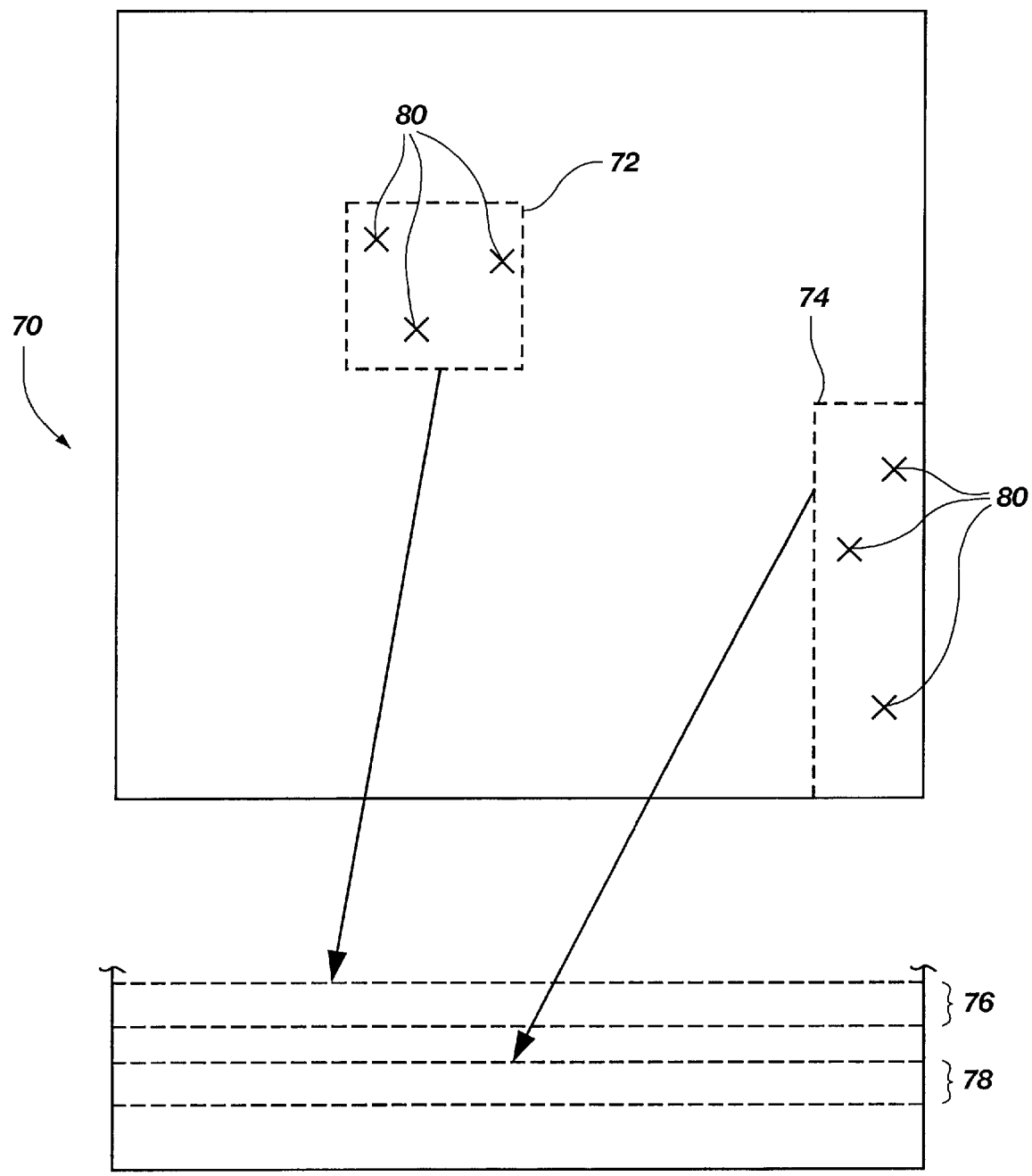
FIG. 2 is a diagram illustrating repair of a semiconductor memory in accordance with the present invention.

As shown in FIG. 2, a semiconductor memory 70 is repaired in accordance with the present invention by replacing memory blocks 72 and 74 with respective redundant rows 76 and 78. The position and dimensions (i.e., number of rows and columns spanned) of the blocks 72 and 74 are adjustable so an optimum number of defective memory cells 80 may be repaired using a minimum number of redundant rows. As a result, the present invention provides a highly efficient device and method for repairing a semiconductor memory. Also, the present invention provides such repair efficiency without the excessive need for fuses characteristic of the Rountree repair system previously discussed.

Figure 3:
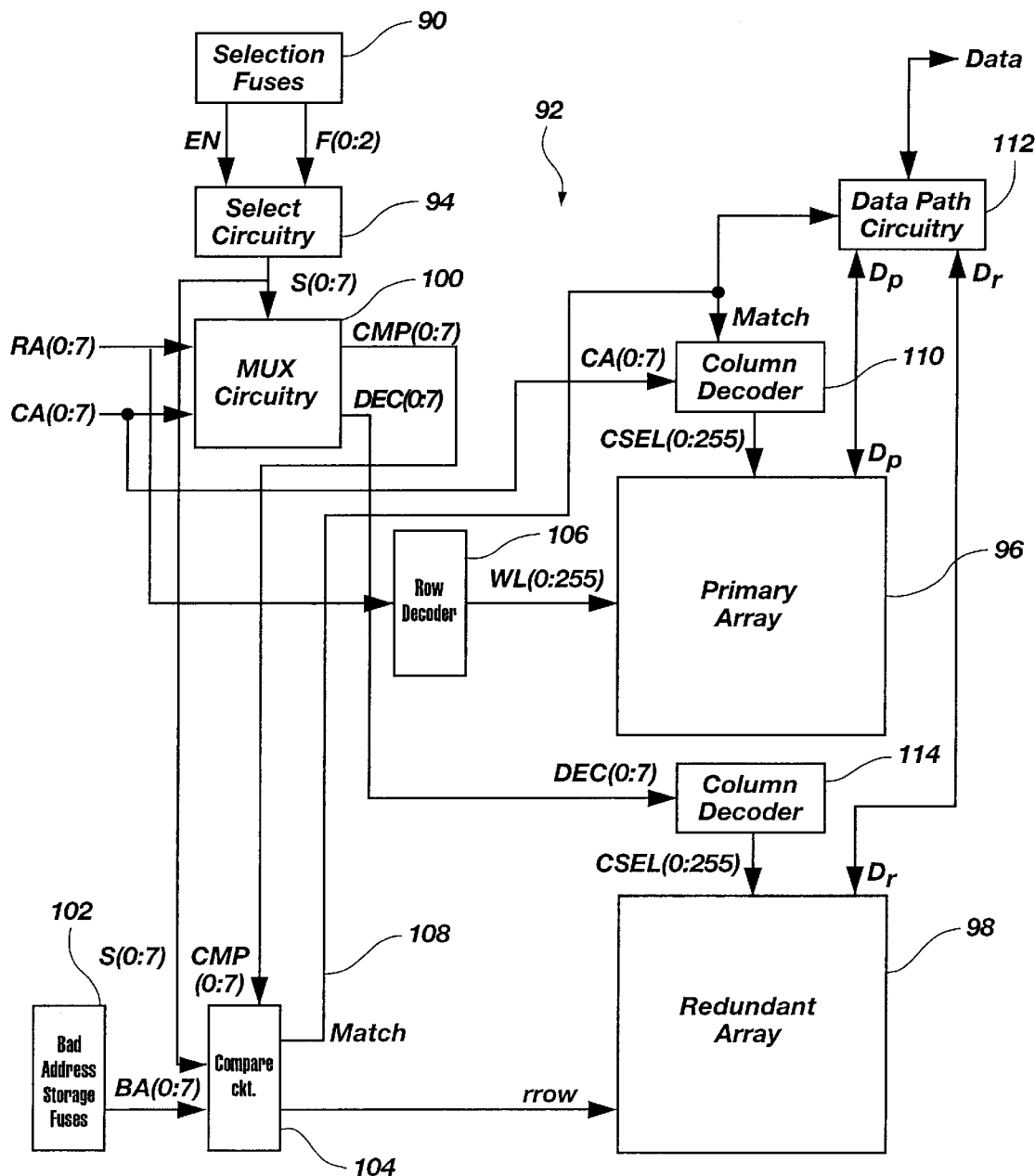
FIG. 3 is a block diagram showing a semiconductor memory in accordance with the present invention.

As shown in FIG. 3, selection fuses 90 in a 64 KB semiconductor memory 92 of the present invention may be programmed to output a block repair enable signal EN and fuse signals F(0:2) to select circuitry 94. When active, the block repair enable signal EN enables a block repair within a primary array 96 of the memory 92 using a selected redundant row within a redundant array 98 of the memory 92. When inactive, the block repair enable signal EN enables conventional row repair within the primary array 96 using the selected redundant row. When block repair is enabled within the primary array 96, the status of the fuse signals F(0:2) determines the dimensions of the repaired block. Together, the fuse signals F(0:2) and the block repair enable signal EN may sometimes be referred to as a "block repair configuration."

It should be understood that only one enable signal EN and only one set of fuse signals F(0:2) are shown in FIG. 3 for purposes of clarity. In fact, redundant rows (e.g., arrow$_0$, arrow$_1$, arrow$_2$, etc.) within the redundant array 98 typically each have their own enable signal (i.e., EN$_0$, EN$_1$, EN$_2$, etc.) and their own set of fuse signals (i.e., F$_0$(0:2), F$_1$(0:2), F$_2$(0:2), etc.) so that block repair or conventional repair can be selected for each redundant row using its enable signal, and so the dimensions of the repair block can be determined for each redundant row using its fuse signals if block repair is selected.

Although the present invention will be described with respect to a 64 KB memory, it should be understood that the invention is applicable to any size memory. It should also be understood that the invention is applicable to a wide variety of semiconductor memories, including, for example, Dynamic Random Access Memories (DRAMs) and Static RAMs (SRAMs). Further, it should be understood that any non-volatile element (e.g., fuses, anti-fuses, or flash EEPROM cells) will work for purposes of the selection fuses 90, as will be explained in more detail below with respect to FIGS. 4A, 4B, and 4C.

Upon receiving the enable signal EN and the fuse signals F(0:2), the select circuitry 94 outputs selection signals S(0:7) as follows:

TABLE 1

| EN | F2 | F1 | F0 | S7 | S6 | S5 | S4 | S3 | S2 | S1 | S0 | S(0:7) |
|---|---|---|---|---|---|---|---|---|---|---|---|---|
| 0 | 0 | 0 | 0 | 0 | 0 | 0 | 0 | 0 | 0 | 0 | 0 | 0 |
| 1 | 0 | 0 | 0 | 0 | 0 | 0 | 0 | 0 | 0 | 0 | 1 | 1 |

TABLE 1-continued

| EN | F2 | F1 | F0 | S7 | S6 | S5 | S4 | S3 | S2 | S1 | S0 | S(0:7) |
|----|----|----|----|----|----|----|----|----|----|----|----|--------|
| 1 | 0 | 0 | 1 | 0 | 0 | 0 | 0 | 0 | 0 | 1 | 1 | 3 |
| 1 | 0 | 1 | 0 | 0 | 0 | 0 | 0 | 0 | 1 | 1 | 1 | 7 |
| 1 | 0 | 1 | 1 | 0 | 0 | 0 | 0 | 1 | 1 | 1 | 1 | 15 |
| 1 | 1 | 0 | 0 | 0 | 0 | 0 | 1 | 1 | 1 | 1 | 1 | 31 |
| 1 | 1 | 0 | 1 | 0 | 0 | 1 | 1 | 1 | 1 | 1 | 1 | 63 |
| 1 | 1 | 1 | 0 | 0 | 1 | 1 | 1 | 1 | 1 | 1 | 1 | 127 |
| 1 | 1 | 1 | 1 | 1 | 1 | 1 | 1 | 1 | 1 | 1 | 1 | 255 |

Of course, it should be understood that although only one set of selection signals S(0:7) are discussed here, in fact each redundant row within the redundant row 98 typically has an associated set of selection signals S(0:7).

In response to the selection signals S(0:7), and upon receiving row address signals RA(0:7) during a memory operation, mux circuitry 100 outputs compare signals CMP (0:7) as follows:

TABLE 2

| S(0:7) | CMP7 | CMP6 | CMP5 | CMP4 | CMP3 | CMP2 | CMP1 | CMP0 |
|--------|------|------|------|------|------|------|------|------|
| 0 | RA7 | RA6 | RA5 | RA4 | RA3 | RA2 | RA1 | RA0 |
| 1 | RA7 | RA6 | RA5 | RA4 | RA3 | RA2 | RA1 | φ |
| 3 | RA7 | RA6 | RA5 | RA4 | RA3 | RA2 | φ | φ |
| 7 | RA7 | RA6 | RA5 | RA4 | RA3 | φ | φ | φ |
| 15 | RA7 | RA6 | RA5 | RA4 | φ | φ | φ | φ |
| 31 | RA7 | RA6 | RA5 | φ | φ | φ | φ | φ |
| 63 | RA7 | RA6 | φ | φ | φ | φ | φ | φ |
| 127 | RA7 | φ | φ | φ | φ | φ | φ | φ |
| 255 | φ | φ | φ | φ | φ | φ | φ | φ |

Of course, each redundant row within the redundant array 98 typically has its own associated set of compare signals CMP(0:7).

The mux circuitry 100 thus passes the most significant bits of the row address RA (0:7) through in accordance with the selection signals S(0:7). As will be discussed below, this determines the "height" (i.e., the number of rows spanned) of a repair block. Thus, for example, with the selection signals S(0:7) all set to zero, the repair block has the height of a single row (because all bits of the row address RA(0:7) are passed through as compare signals CMP(0:7)). This only occurs when the repair block enable signal EN is inactive, so that conventional row repair is enabled. If, instead, the selection signals S(0:7) are set to fifteen, for example, then the repair block is sixteen rows high (because the four most significant bits of the row address RA(0:7) are passed through the mux circuitry 100). Finally, if the selection signals S(0:7) are set to two-hundred fifty-five for example, then the repair block is two-hundred fifty-six rows high (i.e., the height of an entire column).

A portion of the address of a defective memory cell within the primary array 96 is stored using bad address storage fuses 102 and is output by the fuses 102 as bad address BA(0:7). If, for example, conventional row repair is being used to repair the defective memory cell, then the fuses 102 are programmed to output a bad address BA(0:7) equivalent to the row address of the defective cell. If, instead, a repair block sixteen rows high, for example, is being used to repair the defective cell, then the fuses 102 are programmed so the four most significant bits of the bad address (i.e., BA7, BA6, BA5, and BA4) match the four most significant bits of the row address of the defective cell, and so the four least significant bits of the bad address (i.e., BA3, BA2, BA1, and BA0) match the four most significant bits of the column address of the defective cell (for reasons that will be explained below). Finally, if the repair block used to repair the defective cell is an entire column within the primary array 96, then none of the fuses 102 are programmed with bits from the row address of the defective memory cell. Instead, the fuses 102 are programmed with the column address of the defective memory cell (again, for reasons that will be explained below).

Of course, it should be understood that each redundant row in the redundant array 98 typically has its own associated bad address BA(0:7). Only one is discussed here for purposes of clarity. Also, it should be understood that the fuses 102 may comprise any non-volatile element including, for example, fuses, anti-fuses, or flash EEPROM cells, as will be discussed below with respect to FIGS. 4A, 4B, and 4C.

Upon receiving the compare signals CMP(0:7), compare circuitry 104 compares any portion of the compare signals CMP(0:7) that includes bits of the row address RA(0:7) with any corresponding portion of the bad address BA(0:7) that contains bits of the row address of the defective memory cell. If a match occurs, the compare circuitry 104 fires a redundant row within the redundant array 98.

More specifically, the compare circuitry 104 masks out any portion of the compare signals CMP(0:7) and the bad address BA(0:7) that does not include a row address bit using the selection signals S(0:7) as the mask. The remaining portions of the compare signals CMP(0:7) and the bad address BA(0:7) that do include row address bits are then compared, and the selected redundant row is fired when a match occurs. This process is summarized by the following logic equation:

$$\text{rrow} = \text{CMP}(0:7) \cdot S^*(0:7) \odot \text{BA}(0:7) \cdot S^*(0:7) \qquad (1)$$

where a "*" indicates a logical complement, a "·" indicates a logical AND operation, and a "⊙" indicates a logical XAND operation (the complement of a logical XOR operation).

Thus, for example, if block repair is enabled and the repair block is sixteen rows high, then the masking and comparing operations are as follows in the case of a match:

| | |
|---|---|
| 10101101 | CMP(0:7) |
| 11110000 | S*(0:7) |
| | |
| 10100000 | masked CMP(0:7) |
| 10101101 | BA(0:7) |
| 11110000 | S*(0:7) |
| | |
| 10100000 | masked BA(0:7) |
| 10100000 | masked CMP(0:7) |
| 10100000 | masked BA(0:7) |
| | |
| 11111111 | match, so fire rrow |

At the same time a redundant row (e.g., arrow) within the redundant array 98 is being fired as the result of a match within the compare circuitry 104, the received row address RA(0:7) is causing a row decoder 106 associated with the primary array 96 to fire a selected one of 256 primary rows WL(0:255). Thus, both a redundant row and a primary row are fired while the semiconductor memory 92 awaits a column address CA(0:7) to determine whether data will be written to or read from the primary array 96 or the redundant array 98.

Upon receiving the column address CA(0:7), the mux circuitry 100 updates the compare signals CMP(0:7) to include the column address CA(0:7) as follows:

TABLE 3

| S(0:7) | CMP7 | CMP6 | CMP5 | CMP4 | CMP3 | CMP2 | CMP1 | CMP0 |
|---|---|---|---|---|---|---|---|---|
| 0 | RA7 | RA6 | RA5 | RA4 | RA3 | RA2 | RA1 | RA0 |
| 1 | RA7 | RA6 | RA5 | RA4 | RA3 | RA2 | RA1 | CA7 |
| 3 | RA7 | RA6 | RA5 | RA4 | RA3 | RA2 | CA6 | CA7 |
| 7 | RA7 | RA6 | RA5 | RA4 | RA3 | CA5 | CA6 | CA7 |
| 15 | RA7 | RA6 | RA5 | RA4 | CA4 | CA5 | CA6 | CA7 |
| 31 | RA7 | RA6 | RA5 | CA3 | CA4 | CA5 | CA6 | CA7 |
| 63 | RA7 | RA6 | CA2 | CA3 | CA4 | CA5 | CA6 | CA7 |
| 127 | RA7 | CA1 | CA2 | CA3 | CA4 | CA5 | CA6 | CA7 |
| 255 | CA0 | CA1 | CA2 | CA3 | CA4 | CA5 | CA6 | CA7 |

Upon receiving the updated compare signals CMP(0:7), the compare circuitry 104 compares the updated compare signals CMP(0:7) to the bad address BA(0:7). When a match occurs, the circuitry 104 activates a match signal 108 that deactivates a column decoder 110 associated with the primary array 96 and directs data path circuitry 112 to input or output data $D_r$ from the redundant array 98. When a match does not occur, the column decoder 110 remains active and it selects data $D_p$ from the primary array 96 in accordance with the column address CA(0:7) for inputting or outputting through the data path circuitry 112. This process is summarized by the following logic equation:

$$\text{match} = \text{CMP}(0:7) \odot \text{BA}(0:7) \qquad (2)$$

When data $D_r$ is written to or read from the redundant array 98, it is selected by a column decoder 114 in accordance with redundant decode signals DEC(0:7) that are output by the mux circuitry 100 as follows:

TABLE 4

| S(0:7) | DEC7 | DEC6 | DEC5 | DEC4 | DEC3 | DEC2 | DEC1 | DEC0 |
|---|---|---|---|---|---|---|---|---|
| 0 | CA0 | CA1 | CA2 | CA3 | CA4 | CA5 | CA6 | CA7 |
| 1 | CA0 | CA1 | CA2 | CA3 | CA4 | CA5 | CA6 | RA0 |
| 3 | CA0 | CA1 | CA2 | CA3 | CA4 | CA5 | RA1 | RA0 |
| 7 | CA0 | CA1 | CA2 | CA3 | CA4 | RA2 | RA1 | RA0 |
| 15 | CA0 | CA1 | CA2 | CA3 | RA3 | RA2 | RA1 | RA0 |
| 31 | CA0 | CA1 | CA2 | RA4 | RA3 | RA2 | RA1 | RA0 |
| 63 | CA0 | CA1 | RA5 | RA4 | RA3 | RA2 | RA1 | RA0 |
| 127 | CA0 | RA6 | RA5 | RA4 | RA3 | RA2 | RA1 | RA0 |
| 255 | RA7 | RA6 | RA5 | RA4 | RA3 | RA2 | RA1 | RA0 |

Of course, it will be understood that each redundant row within the redundant array 98 has its own associated set of redundant decode signals. Only one set is described here for purposes of clarity.

Figure 4A:
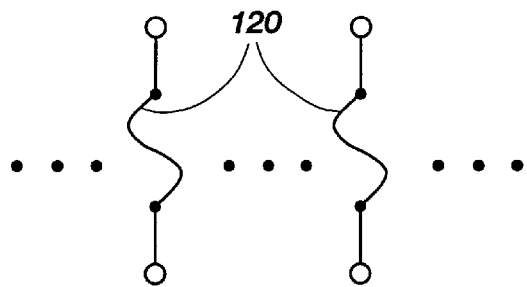
FIGS. 4A, 4B, and 4C are circuit schematics showing fuses, anti-fuses, and flash EEPROM cells capable of use as non-volatile elements in the semiconductor memory of FIG. 3.
Figure 4B:
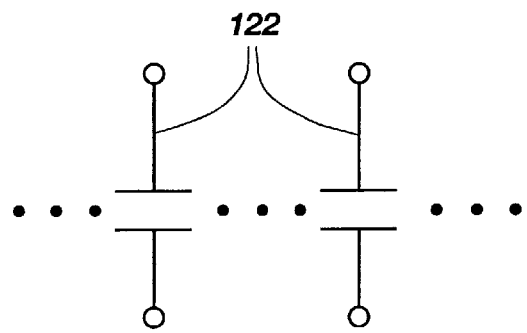
Figure 4C:
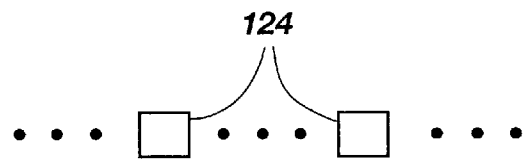

The selection fuses 90 and the bad address storage fuses 102 of FIG. 3 may comprise any non-volatile elements including, for example, fuses 120 as shown in FIG. 4A, anti-fuses 122 as shown in FIG. 4B, and flash EEPROM cells as shown in FIG. 4C.

Figure 5:
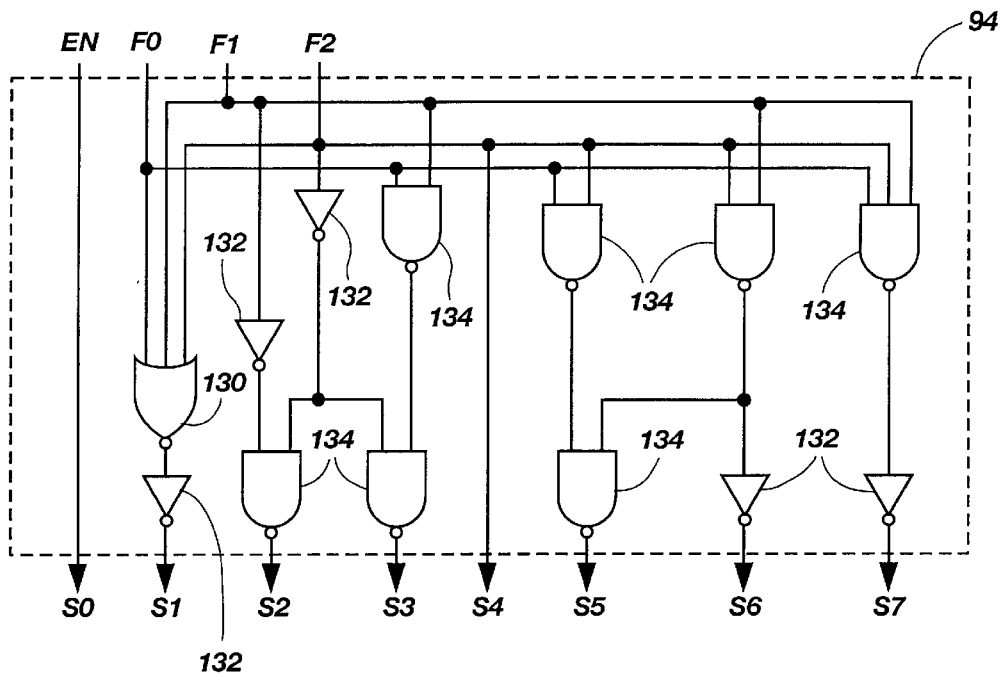
FIG. 5 is a circuit schematic showing select circuitry of the semiconductor memory of FIG. 3 in more detail.

As shown in FIG. 5, the select circuitry 94 of FIG. 3 includes a NOR gate 130, inverters 132, and NAND gates 134 for implementing the operations of the circuitry 94 as described above with respect to Table 1. Of course, it should be understood that any device for selecting the height and width of a repair block will work for purposes of the present invention, and that such a device need not necessarily include the circuitry shown in FIG. 5 or operate in accordance with Table 1.

Figure 6:
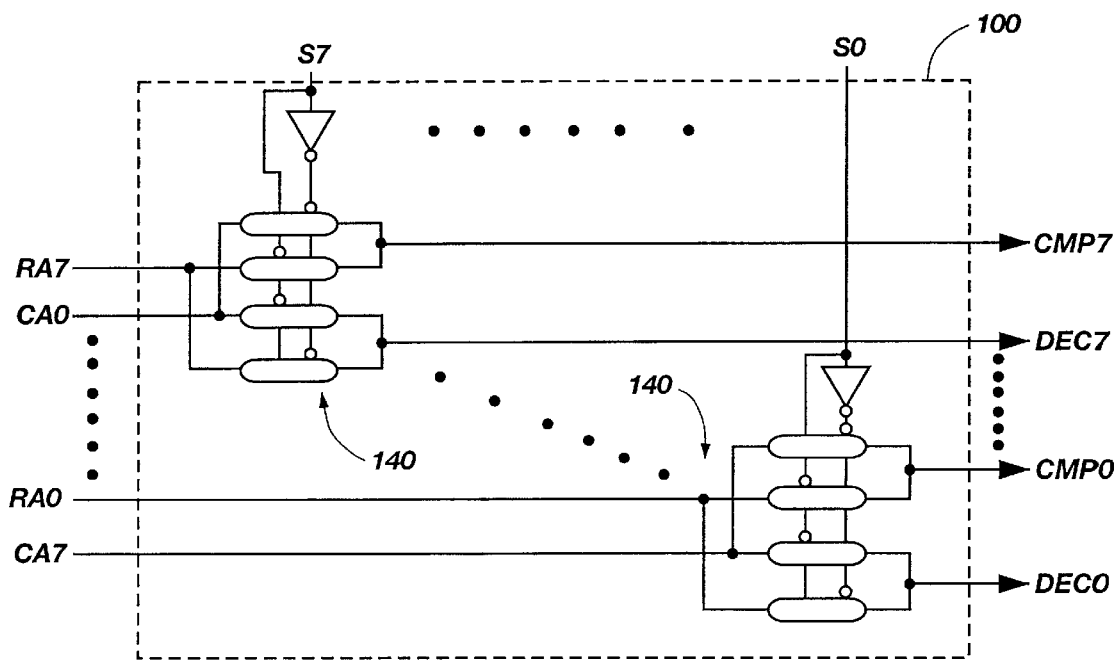
FIG. 6 is a circuit schematic showing mux circuitry of the semiconductor memory of FIG. 3 in more detail.

As shown in FIG. 6, the mux circuitry 100 includes a plurality of mux circuits 140 for implementing the operations of the circuitry 100 as described above with respect to Tables 2, 3, and 4. Again, it should be understood that any device for routing the proper row and column addresses to the compare circuitry 104 (see FIG. 3) will work for purposes of the present invention, and that such a device need not necessarily operate in accordance with Tables 2, 3, and 4.

Figure 7:
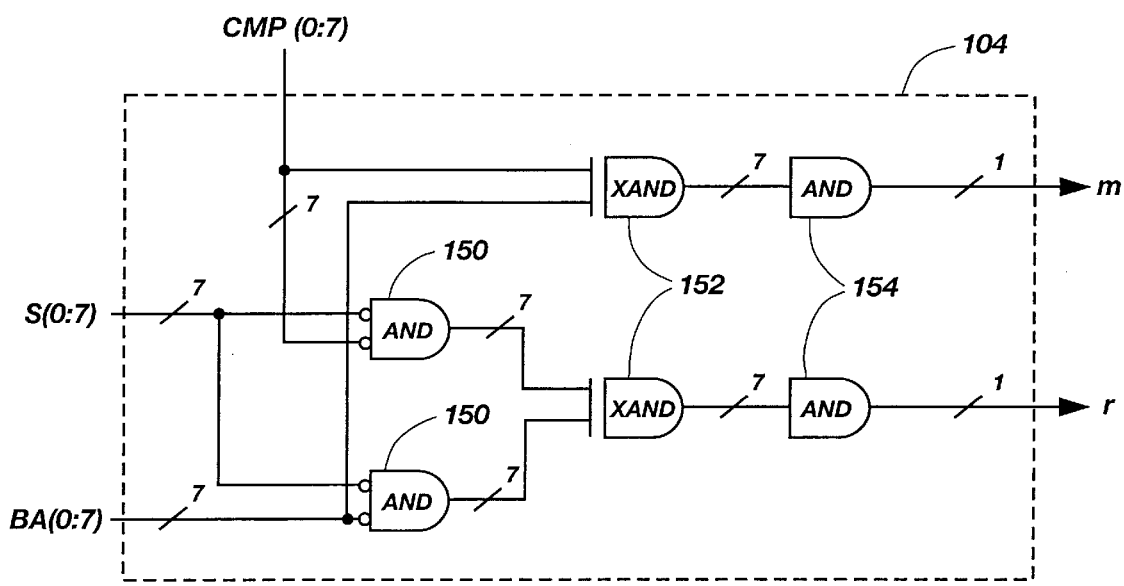
FIG. 7 is a circuit schematic showing compare circuitry of the semiconductor memory of FIG. 3 in more detail.

As shown in FIG. 7, the compare circuitry 104 includes logic low input AND gates 150, XAND gates 152 (each comprising, e.g., an XOR gate in series with an inverter), and AND gates 154 for implementing the operations of the circuitry 104 as described above with respect to equations (1) and (2). It should be understood that the gates 150, 152, and 154 are representative only, and that an actual implementation of the compare circuitry 104 would likely include multiple gates for performing the operations of the circuitry 104. For example, the logic low input AND gates 150 are shown in FIG. 7 as receiving fourteen inputs each and outputting seven outputs each. In reality, each of the gates 150 is typically implemented using seven low input AND gates, with each such gate receiving two inputs and outputting one output. Further, it should be understood that any device for comparing the compare signals CMP(0:7) to the bad address BA(0:7) will work for purposes of the present invention, and that such a device need not necessarily work using the masking and comparing operations described above with respect to FIG. 3.

It should be noted that, as described thus far, the present invention only uses repair blocks that stay within "logical" boundaries of the primary array 96 of FIG. 3. In addition, a repair block that spans one quarter of the rows in the top half of the primary array 96, for example, and one quarter of the rows in the bottom half can be implemented using an alternative embodiment described below.

In this alternative embodiment, repair blocks that cross logical boundaries within the primary array 96 of FIG. 3 may be used. For example, a repair block that spans an odd number of rows in the top half of the primary array 96 and an even number of rows in the bottom half can be implemented using this alternative embodiment. Such an embodiment typically requires that additional bad address storage fuses 102 (see FIG. 3) be provided to store additional bits from the row and column addresses of a defective memory cell. These additional bits are typically necessary to identify a match when row and column addresses are received. Such an embodiment also typically requires that the compare circuitry 104 (see FIG. 3) be constructed to perform the necessary logical operations to determine a match. This embodiment thus requires additional fuses or other non-volatile elements, but provides greater flexibility in selecting the optimum location of repair blocks.

In the specific example described, the row address Most Significant Bit (MSB) may be replaced with an XOR function of the MSB and the next lower row address term for the repair address match. Likewise, logical combinations of column address terms may be used in place of single column address terms to "shift" or split the repair block in the column dimension. For example, replacing the column MSB with an XAND function of the two most significant column address bits will split the repair block and match upper and lower quarters of the column address space rather than upper or lower halfs.

Figure 8:
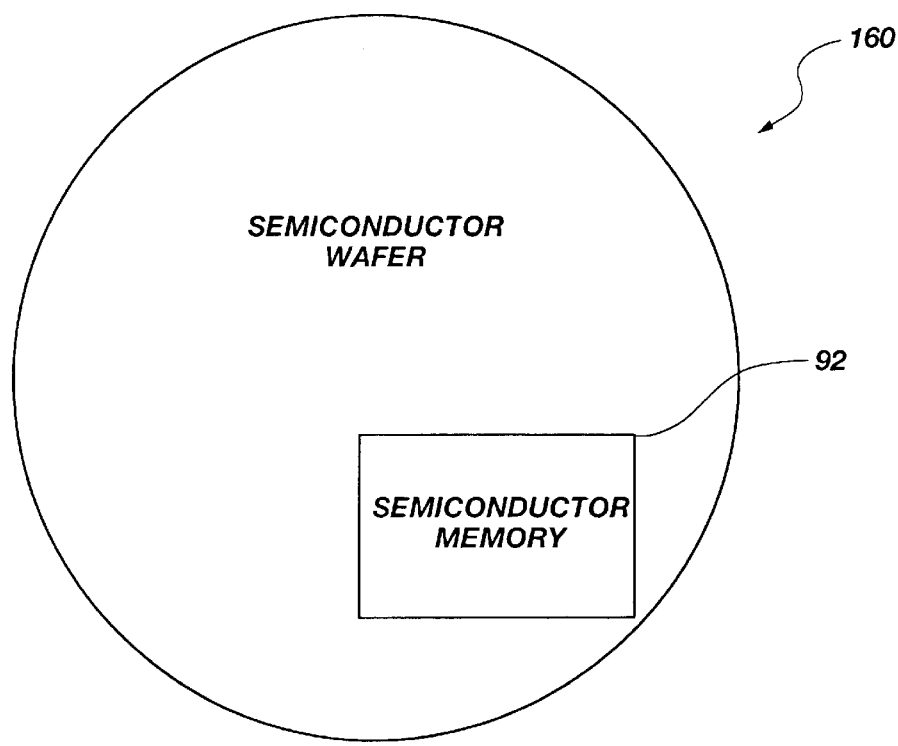
FIG. 8 is a diagram illustrating a semiconductor wafer on which the semiconductor memory of FIG. 3 is fabricated.

As shown in FIG. 8, the semiconductor memory 92 of FIG. 3 is fabricated on a semiconductor wafer 160. It should be understood that the memory 92 may also be fabricated on a wide variety of other semiconductor substrates including, for example, a Silicon-On-Insulator (SOI) substrate, a Silicon-On-Glass (SOG) substrate, and a Silicon-On-Sapphire (SOS) substrate.

Figure 9:
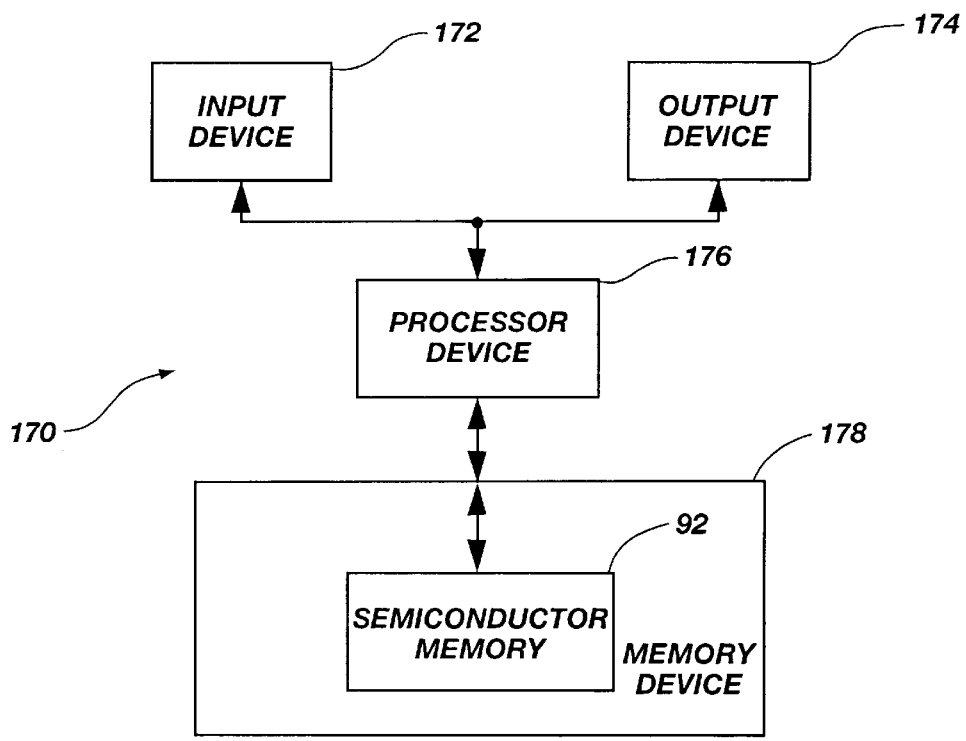
FIG. 9 is a block diagram of an electronic system incorporating the semiconductor memory of FIG. 3.

As shown in FIG. 9, an electronic system 170 includes an input device 172, an output device 174, a processor device 176, and a memory device 178 that incorporates the semiconductor memory 92 of FIG. 3. Of course, it should be understood that the semiconductor memory 92 may also be incorporated into any one of the input, output, and processor devices 172, 174, and 176.

Although the present invention has been described with reference to particular embodiments, the invention is not limited to these described embodiments. Rather, the invention is limited only by the appended claims, which include within their scope all equivalent devices or methods that operate according to the principles of the invention as described.

I claim:

1. A semiconductor memory comprising:
    a primary array;
    a first set of non-volatile elements for storing at least a portion of an address of a defective cell of the primary array;
    a redundant array having a redundant row;
    data path circuitry coupled to the primary and redundant arrays for writing data thereto and reading data therefrom;
    a second set of non-volatile elements for storing a block repair configuration;
    routing circuitry coupled to the second set of non-volatile elements to be configured by the block repair configuration to output a selected ratio of received row address bits to received column address bits; and
    comparison circuitry coupled to the first set of non-volatile elements, the redundant array, the data path circuitry, and the routing circuitry for comparing the row and column address bits output by the routing circuitry with the stored portion of the defective cell address and, when a match occurs, for implementing a block repair of the defective cell by activating the redundant row in the redundant array and directing the data path circuitry to write data to or read data from the activated redundant row instead of the primary array.

2. The semiconductor memory of claim 1 wherein the primary and redundant arrays are selected from a group comprising Dynamic Random Access Memory (DRAM) arrays and Static RAM (SRAM) arrays.

3. The semiconductor memory of claim 1 wherein the non-volatile elements are selected from a group comprising fuses, anti-fuses, and flash EEPROM cells.

4. The semiconductor memory of claim 1 wherein the first set of non-volatile elements comprise non-volatile elements for storing at least a portion of the row address and at least a portion of the column address of the defective cell.

5. The semiconductor memory of claim 1 wherein the routing circuitry comprises select circuitry and mux circuitry.

6. The semiconductor memory of claim 5 wherein the select circuitry comprises inverters, NOR gates, and NAND gates, and wherein the mux circuitry comprises muxes and inverters.

7. The semiconductor memory of claim 1 wherein the comparison circuitry comprises AND gates and XAND gates.

8. The semiconductor memory of claim 1 wherein the comparison circuitry includes circuitry for masking column address bits output by the routing circuitry and column address bits in the stored portion of the defective cell address prior to comparing the address bits output by the routing circuitry with the stored portion of the defective cell address.

9. The semiconductor memory of claim 1 wherein the second set of non-volatile elements includes a block repair enabling non-volatile element for enabling block repairs when active and disabling block repairs, and thereby enabling conventional row repairs, when inactive.

10. The semiconductor memory of claim 9 wherein the first set of non-volatile elements stores only row address bits of the defective cell.

11. The semiconductor memory of claim 1 wherein the comparison circuitry comprises circuitry for implementing a block repair that does not cross logical boundaries within the primary array.

12. A Dynamic Random Access Memory (DRAM) comprising:
    a primary DRAM array;
    bad address storage fuses for storing at least a portion of an address of a defective cell of the primary DRAM array;
    a redundant DRAM array having a redundant row;
    data path circuitry coupled to the primary and redundant DRAM arrays for writing data thereto and reading data therefrom;
    row and column decoders coupled to the primary DRAM array for selecting cells therein in accordance with received row and column addresses;
    selection fuses for storing a block repair configuration;
    selection and mux circuitry coupled to the selection fuses to be configured by the block repair configuration to output a selected ratio of received row address bits to received column address bits; and
    comparison circuitry coupled to the bad address storage fuses, the redundant DRAM array, the data path circuitry, the primary DRAM array column decoder, and the selection and mux circuitry for comparing the row and column address bits output by the selection and mux circuitry with the stored portion of the defective cell address and, when a match occurs, for implementing a block repair of the defective cell by activating the redundant row in the redundant DRAM array, by disabling the primary DRAM array column decoder, and by directing the data path circuitry to write data to or read data from the activated redundant row instead of the primary DRAM array.

13. A block repair device for a semiconductor memory having a primary array and a redundant array with a redundant row, the block repair device comprising:

a set of non-volatile elements for storing a block repair configuration;

routing circuitry coupled to the non-volatile elements to be configured by the block repair configuration to output a selected ratio of received row address bits to received column address bits; and comparison circuitry coupled to the routing circuitry for comparing the row and column address bits output by the routing circuitry with a stored portion of an address of a defective cell of the primary array and, when a match occurs, for implementing a block repair of the defective cell by activating the redundant row and causing data to be written to or read from the activated redundant row instead of the primary array.

14. A semiconductor substrate on which is fabricated a semiconductor memory comprising:

a primary array;

a first set of non-volatile elements for storing at least a portion of an address of a defective cell of the primary array;

a redundant array having a redundant row;

data path circuitry coupled to the primary and redundant arrays for writing data thereto and reading data therefrom;

a second set of non-volatile elements for storing a block repair configuration; routing circuitry coupled to the second set of non-volatile elements to be configured by the block repair configuration to output a selected ratio of received row address bits to received column address bits; and comparison circuitry coupled to the first set of non-volatile elements, the redundant array, the data path circuitry, and the routing circuitry for comparing the row and column address bits output by the routing circuitry with the stored portion of the defective cell address and, when a match occurs, for implementing a block repair of the defective cell by activating the redundant row in the redundant array and directing the data path circuitry to write data to or read data from the activated redundant row instead of the primary array.

15. The semiconductor substrate of claim 14 wherein the substrate comprises a semiconductor wafer.

16. An electronic system comprising an input device, an output device, a memory device, and a processor device coupled to the input, output, and memory devices, at least one of the input, output, memory, and processor devices including a semiconductor memory comprising:

a primary array;

a first set of non-volatile elements for storing at least a portion of an address of a defective cell of the primary array;

a redundant array having a redundant row;

data path circuitry coupled to the primary and redundant arrays for writing data thereto and reading data therefrom;

a second set of non-volatile elements for storing a block repair configuration;

routing circuitry coupled to the second set of non-volatile elements to be configured by the block repair configuration to output a selected ratio of received row address bits to received column address bits; and comparison circuitry coupled to the first set of non-volatile elements, the redundant array, the data path circuitry, and the routing circuitry for comparing the row and column address bits output by the routing circuitry with the stored portion of the defective cell address and, when a match occurs, for implementing a block repair of the defective cell by activating the redundant row in the redundant array and directing the data path circuitry to write data to or read data from the activated redundant row instead of the primary array.

17. A block repair method for a semiconductor memory having a primary array with a defective cell and a redundant array with a redundant row, the block repair method comprising:

selecting the dimensions of a repair block within the primary array for repairing the defective cell;

programming non-volatile elements within the semiconductor memory to store those row and column address bits of the defective cell that define the selected dimensions of the repair block;

programming other non-volatile elements within the semiconductor memory to store a block repair configuration that corresponds to the selected dimensions of the repair block;

in accordance with the block repair configuration, routing those received row and column address bits necessary to determine whether a received address falls within the repair block for comparison with the stored row and column address bits of the defective cell; and when a match occurs, firing the redundant row and writing data to or reading data from a cell within the redundant row selected in accordance with those row and column address bits of the defective cell not stored by the non-volatile elements.

18. The block repair method of claim 17 wherein the steps of programming non-volatile elements comprise programming non-volatile elements selected from a group comprising fuses, anti-fuses, and flash EEPROM cells.

19. A block repair method for a semiconductor memory having a primary array with a defective cell and a redundant array with a redundant row, the block repair method comprising:

selecting the dimensions of a repair block within the primary array for repairing the defective cell;

storing those row and column address bits of the defective cell that define the selected dimensions of the repair block;

storing a block repair configuration that corresponds to the selected dimensions of the repair block;

in accordance with the block repair configuration, routing those received row and column address bits necessary to determine whether a received address falls within the repair block for comparison with the stored row and column address bits of the defective cell; and when a match occurs, firing the redundant row and writing data to or reading data from a cell within the redundant row selected in accordance with any non stored row and column address bits of the defective cell.

20. The block repair method of claim 19 wherein both steps of storing comprise storing using non-volatile elements selected from a group comprising fuses, anti-fuses, and flash EEPROM cells.

21. The block repair method of claim 19 wherein the step of routing received row and column address bits comprises muxing received row and column address bits in accordance with the block repair configuration.

22. The block repair method of claim 19, further comprising, when a match occurs, disabling memory operations within the primary array by disabling a column decoder associated with the primary array.

23. The block repair method of claim 19 wherein the step of writing data to or reading data from a cell within the redundant row comprises writing data to or reading data from the cell selected by a column decoder associated with the redundant array.

24. The block repair method of claim 19 wherein the step of storing a block repair configuration includes programming a non-volatile element to enable block repair with respect to the redundant row.

25. The block repair method of claim 19 wherein the step of storing a block repair configuration includes programming a non-volatile element to disable block repair with respect to the redundant row and thereby enable conventional row repair using the redundant row.

26. The block repair method of claim 25 wherein the step of storing those row and column address bits of the defective cell that define the selected dimensions of the repair block comprises storing only row address bits of the defective cell.

* * * * *

UNITED STATES PATENT AND TRADEMARK OFFICE
CERTIFICATE OF CORRECTION

PATENT NO. : 6,199,177 B1
DATED : March 6, 2001
INVENTOR(S) : Greg A. Blodgett

It is certified that error appears in the above-identified patent and that said Letters Patent is hereby corrected as shown below:

Column 4,
Line 40, change "arrow$_0$" to -- rrow$_0$ --
Line 41, change "arrow$_1$, arrow$_2$" to -- rrow$_1$, rrow$_2$ --

Column 5,
Line 13, change "are" to -- is -- and insert a comma after "fact"
Line 14, before "98" change "row" to -- array --

Column 6,
Line 66, change "arrow" to -- rrow --

Column 7,
Line 65, after "cells" and before "as" insert -- 124 --

Column 9,
Line 7, after "half" and before "can" insert -- of the primary array 96 --

Column 10,
Line 3, before "portion" insert -- at least a --
Line 13, after "the" at the end of the line insert -- first and second sets of --
Line 17, change "comprise" to -- comprises --
Line 18, before "row" change "the" to -- a --
Line 19, before "column" change "the" to -- a --
Lines 32 and 34, after "stored" insert -- at least a --

Column 11,
Line 3, after "stored" insert -- at least a --
Line 48, after "stored" and before "portion" insert -- at least a --

UNITED STATES PATENT AND TRADEMARK OFFICE
CERTIFICATE OF CORRECTION

PATENT NO. : 6,199,177 B1
DATED : March 6, 2001
INVENTOR(S) : Greg A. Blodgett

It is certified that error appears in the above-identified patent and that said Letters Patent is hereby corrected as shown below:

Column 12,
Line 11, after "stored" and before "portion" insert -- at least a --

Signed and Sealed this

Twenty-third Day of March, 2004

JON W. DUDAS
*Acting Director of the United States Patent and Trademark Office*